United States Patent [19]

Dougherty, Jr.

[11] 4,259,367
[45] Mar. 31, 1981

[54] FINE LINE REPAIR TECHNIQUE

[75] Inventor: William E. Dougherty, Jr., Poughkeepsie, N.Y.

[73] Assignee: International Business Machines Corporation, Armonk, N.Y.

[21] Appl. No.: 61,951

[22] Filed: Jul. 30, 1979

[51] Int. Cl.³ .............................................. H01L 21/28
[52] U.S. Cl. ........................................ 427/96; 29/575; 250/492 B; 219/121 LM; 427/88; 427/89; 427/140; 427/142; 430/314; 430/317
[58] Field of Search .................. 29/575; 427/140, 142, 427/96, 88, 89; 250/492 B; 219/121 LM; 430/314, 317

[56] References Cited
U.S. PATENT DOCUMENTS

| 3,506,506 | 4/1970 | Pennebaken | 29/575 |
| 3,539,880 | 11/1970 | Squire et al. | 29/575 |
| 3,559,281 | 2/1971 | Mayberry et al. | 29/575 |
| 3,597,834 | 8/1971 | Lathrop et al. | 29/575 |
| 3,705,047 | 12/1972 | Marriott | 427/140 |
| 3,861,023 | 1/1975 | Bennett | 29/575 |
| 3,923,567 | 12/1975 | Lawrence | 29/575 |

*Primary Examiner*—John D. Smith
*Attorney, Agent, or Firm*—Henry Powers

[57] ABSTRACT

Repair of opens and shorts in semiconductor packages and chip metallurgy by initial conversion of shorts into opens by severing of lines about the shorts, followed by interconnection of conductor patch lines to the good circuit portions through an insulating layer.

4 Claims, 7 Drawing Figures

FINE LINE REPAIR TECHNIQUE

DESCRIPTION

1. Technical Field

This invention relates to the repair of integrated circuit packages and circuit metallurgy, and more particularly to the repair of opens and shorts in the metallurgy of multilevel devices.

One object of the present invention is to provide means for increasing the yield in the manufacture of devices and integrated circuits having a multi-level pattern of metal conductors interconnected through insulating layers.

Another object of the present invention is to provide a novel technique for repair of opens and shorts occasioned in the fabrication of multilevel conductor patterns for integrated circuit devices and packages.

2. Background Art

In present day technology, integrated circuits are characterized with intricate and miniaturized circuits with correspondingly large and complex numbers of interconnection patterns requiring the use of more than one level of conductive interconnection patterns each separated by an insulating pattern having via holes for crossover connections between the conductor levels.

The continuing demands of more advanced circuit designs require further demands for densification of components and metallization which tax the tolerances inherent in present day technology. This is a particular problem in the fine line conductor requirements which are reflected in the occasional presence of discontinuities or shorts in conductor runs or shorts between conductor lines resulting from various limitation in processing, as for example, the presence of pin-holes in resists employed for photolithographic delineation of the conductor patterns. As a consequence, this has resulted in the rejection of devices with attendant decrease in yield and increased cost. With the projected high densification of conductor patterns, the present fabrication processes were incapable of being economically employed for repairing the defective (e.g. shorted and/or open) conductors for purposes of reclaiming the devices.

BRIEF DESCRIPTION OF THE DRAWINGS

In the accompaning drawings forming a material part of this disclosure.

DISCLOSURE OF THE INVENTION

For further comprehension of the invention, and of the objects and advantages thereof, reference will be had to the following description and accompanying drawings and to the appended claims in which the novel features of the invention are more particularly set forth.

In accordance with the present invention, there is provided a technique for reclaiming or saivaging electronic packages and integrated devices normally rejected for defects in the conductive metallurgy, in the form of opens and/shorts in the interconnection conductor patterns, particularly as occasioned in multilevel conductor patterns. Basically, all shorted conductor lines are converted into opens, by appropriate severing of the conductor lines below and above the shorted portions so as to isolate the shorted portion as a nonfunctional island. Next, the modified conductor pattern is overcoated with an appropriate dielectric patch layer (e.g. quartz, polyimide, silicon dioxide, silicon nitride, or combination thereof) in sufficient thickness to provide the desired insulation and/or passivation. For multilayered metallurgy, the dielectric layers can optionally and conveniently be applied in a portion normally half the specification thickness required in anticipation for insulation of superposed conductor patterns of multilayer metallurgy. After coating, via holes are formed in the dielectric to expose the terminal portions of the underlying desired basic conductor pattern at all points adjacent all opens. This can be followed by blanket coating the dielectric with the conductor metal, and delineating patch lines over all opens, inclusive of spanning over all shorted areas. A dielectric layer is then formed, normally by a blanket coating, over the conductive patch lines and the dielectric patch layer, which, when employed, can comprise the remaining half or portion of the specification thickness required for insulation of overlying conductive patterns, which can be formed by techniques conventionally employed in fabricating multilayered metallurgy.

BEST MODE FOR CARRYING OUT THE INVENTION

Figure 1:
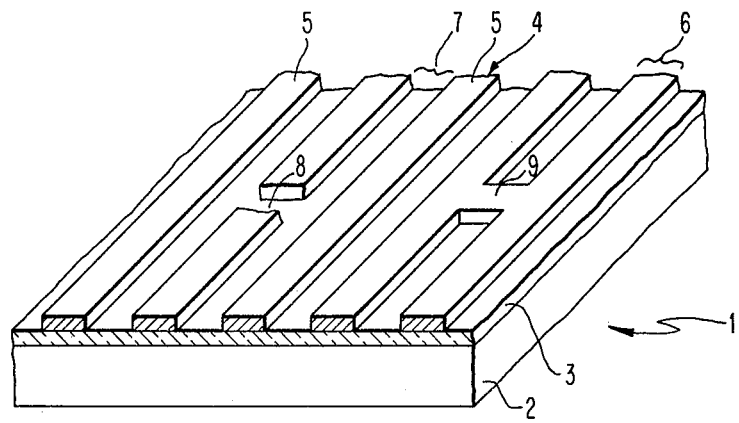
FIGS. 1 to 6 are fragmentary views in perspective illustrating the repair of opens and shorts in the metallurgy of an integrated circuit.

With reference to FIG. 1, shown is a portion 1 of an integrated circuit which will normally have P− and N− type regions providing active and passive components of any conventional integrated circuit such, for example, as described in U.S. Pat. No. 3,539,876 and No. 4,076,575. The active and passive regions in substrate 2 have not been shown since they are not significant to the illustration of the present invention. Substrate 2 is covered with a conventional passivating dielectric or insulative layer 3 which may be any of the conventional materials such as quartz, polyimide silicon dioxide, silicon nitride, or a composite of silicon nitride over silicon dioxide. It should be noted that the structures being described, unless otherwise noted, are conventional integrated circuit structures which may be fabricated by methods known in the art, e.g. U.S. Pat. No. 3,539,876.

For purposes of illustrating the description the dielectric or insulating layer 3, will be considered a composite of a 1000Å thick bottom layer of silicon dioxide covered with a layer of silicon nitride 1600Å in thickness.

A first level metallization pattern 4 is formed over the surface of the dielectric layer 3. This metallization pattern which may be of a thickness of 0.85 microns, may also be of any conventional metal used in integrated circuit or electronic package fabrication. For example, the metallization can comprise aluminum and copper alloys thereof which can be applied by any conventional technique such as those described in said U.S. Pat. No. 3,539,876. The deposition may be, for example, vapor deposition or R.F. sputter or electro or electroless plated deposition. Normally, the metallization can be formed as a blanket coating which can be delineated into the desired pattern by conventional photolithographic techniques. Although the metallization can comprise complex and intricate patterns, however, for purposes of simplifying the description of this invention, the metallization pattern is shown as a series of conductor runs or lines 5. Also, to illustrate the densification of the conductor patterns comprehended in this invention, the widths 6 of the runs can be about 25 microns or less with a spacing 7 between them, as low as about 3 microns.

However, as will be understood, the metallization pattern in configurations normally employed for integrated circuits, and their packages will include connections to various regions in substrate 2 by contacts passing through the dielectric layer 3. These have not been shown since it would not aid in the illustration of the present invention.

As indicated above, since the increasing demands for densification of the metallization patterns are taxing the limits of present day technologies, the delineation of the patterns can exceed the tolerances of the processes to result in opens or discontinuities 8 in the conductor lines 5 and shorts 9 between them. Normally these defects are noted on inspection of the patterns, and their location can be located and translated to software for use with automated photolithographic units such as an E-beam unit.

Figure 2:
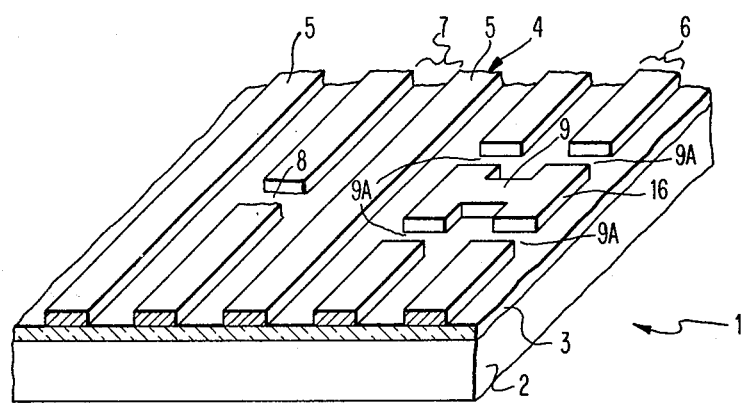
Figure 3:
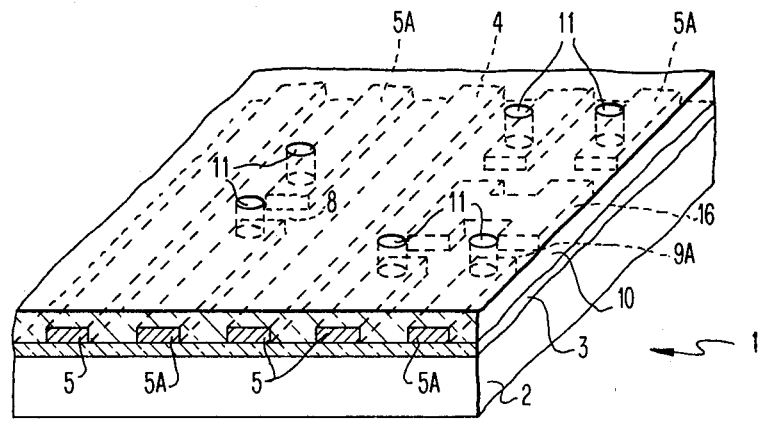
Figure 4:
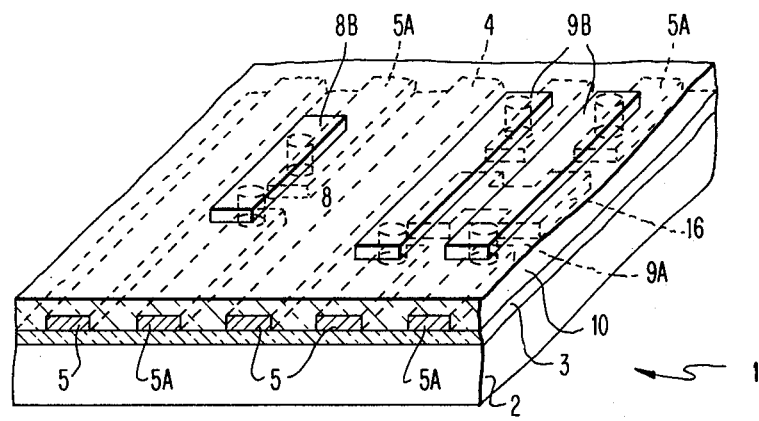
Figure 5:
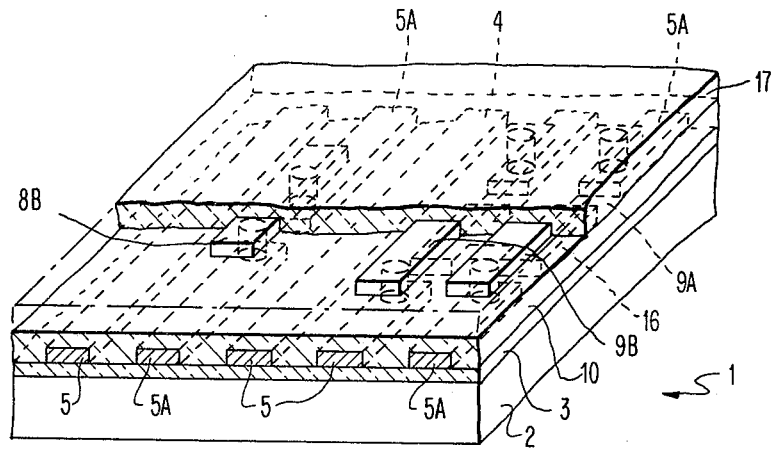
Figure 6A:
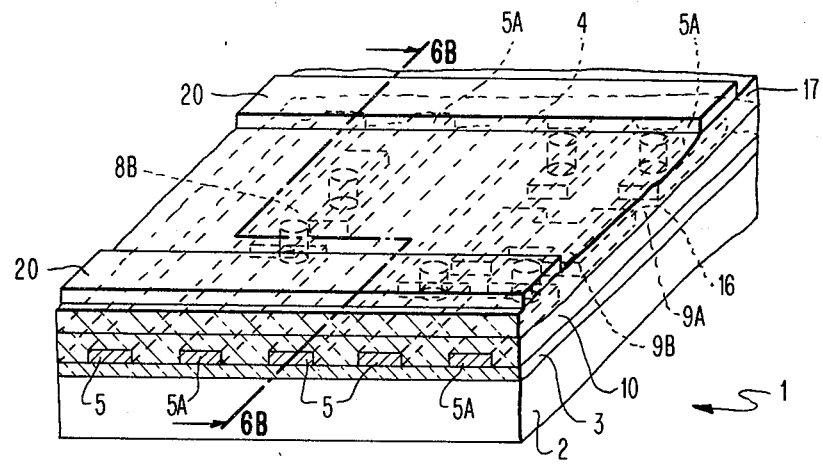
Figure 6B:
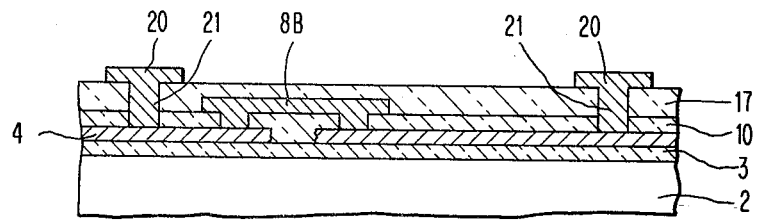

In the next operation all shorts 9 are converted into opens 9A (FIG. 2) by any convenient manner, as by laser or E-beam burn out, or mechanically, or by conventional photolithographic techniques. The substrate is then coated with a blanket layer of a dielectric 10, in a thickness which can comprise a portion, preferably half of the specification thickness required for insulation in the formation of overlying conductor pattern of a multilayered conductor structure. This dielectric can be formed by any of the deposition techniques described in said U.S. Pat. No. 3,539,876, for example, by chemical vapor deposition as well as spraying, cathode sputtering or R.F. sputtering methods. While this layer 10 can be of conventional materials such as silicon nitride, aluminum oxide, polyimide or silicon dioxide, as well as composites thereof, for purposes of the present invention, the layer can comprise a 2–8 micron thick layer of R.F. sputter deposited silicon dioxide.

Next, utilizing conventional photolithographic techniques or laser or E-beam via holes 11 are formed (e.g. etching) through dielectric layer 10 to expose portions at the terminal ends 5A of the desired basic conductor pattern 4 adjacent all opens 8 and 9A, inclusive of those resulting from the fabrication of the original conductor pattern and those formed about the short 9. After this step, the photoresist is removed, and the dielectric blanket coated with a conductive metal layer as noted above, in a minimum thickness sufficient for conductivity, e.g. about 1–2 microns. This conductive layer is then delineated by photolithographic techniques into conductive patch lines 8B bridging open 8, and into conductive patch lines 9B bridging opens 9A and spanning over the isolated shorted portion 16. One effective technique for delineating the patch lines is by E-beam lithography under computer control utilizing programmed location data observed and recorded for the original opens and shorts.

After formation of the patch lines 8B and 9B, the remaining portion 17 of the dielectric is coated over the substrate to the required thickness required for insulation. For example, where the dielectric patch layer 10 was applied at half the required specification thickness (e.g. 1–4 microns) for insulation, the thickness of the final dielectric layer 17 can be the remaining thickness (e.g. 1–4 microns) required for insulation. As will be understood, the dielectric layer 17 can be any of the conventional materials, applied by any conventional technique as discussed above. It may be noted that since the combined dielectric layer 10/17 was applied in two coats, there is an accompanying advantage in the minimization of the possibility of the occurrence of interplane pinholes.

At this point, processing of the substrate can proceed in conventional manner, which can include the completion of multilayer metallization, which, for simplicity, has been illustrated as comprised of merely transverse conductor runs 20 interconnected to the underlying conductor pattern 4 (inclusive of patch lines 8B and 9B) through via connectors 21.

While the invention has been illustrated and described with preferred embodiments of the invention, it is to be understood that the invention is not to be limited to the precise construction herein disclosed and the right is reserved to all changes and modifications coming within the scope of the invention as defined in the appended claims.

Having thus described the invention, what is claimed as new, and desired to be secured by Letters Patent is:

1. A method for repair of opens and shorts in planar semiconductor device metallurgy comprising:
   (a) deleting portions of conductor lines on both sides of any shorted sections to form opens for electrically isolating said sections;
   (b) coating said device over said metallurgy with a dielectric layer;
   (c) forming vias in the dielectric to the terminal ends of the basic conductor lines adjacent all opens; and
   (d) forming conductor patch lines on the dielectric layer over the opens in extension through said vias to the open-adjacent ends of the basic underlying conductor lines as part of said first level metallurgy.

2. The method of claim 1 including:
   (a) coating a second layer of a dielectric on said first said layer over said patch lines, and
   (b) forming vias through said first and second dielectric layers to predetermined points of said first level metallurgy, and
   (c) forming second level metallurgy on said second dielectric layer in interconnection with said first level metallurgy.

3. The method of claim 2 wherein said first dielectric layer comprises a fractional portion of the desired specification thickness, and said second dielectric layer comprises the remainder of said desired specification thickness.

4. The method of claim 3 wherein said first dielectric layer comprises about one-half said desired specification thickness.

* * * * *